United States Patent
Nakamura et al.

(10) Patent No.: US 10,400,775 B2
(45) Date of Patent: Sep. 3, 2019

(54) VACUUM VALVE AND VACUUM PUMP

(71) Applicant: SHIMADZU CORPORATION, Kyoto (JP)

(72) Inventors: Masaya Nakamura, Kyoto (JP); Junichiro Kozaki, Kyoto (JP); Atsuo Nakatani, Kyoto (JP); Nobuyuki Hirata, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 15/863,895

(22) Filed: Jan. 6, 2018

(65) Prior Publication Data

US 2018/0195519 A1 Jul. 12, 2018

(30) Foreign Application Priority Data

Jan. 12, 2017 (JP) ................................ 2017-003448

(51) Int. Cl.
| | |
|---|---|
| *F04D 27/00* | (2006.01) |
| *F16K 31/04* | (2006.01) |
| *F16K 51/02* | (2006.01) |
| *F16K 3/06* | (2006.01) |
| *F04D 19/04* | (2006.01) |
| *H01L 21/67* | (2006.01) |
| *F04D 29/40* | (2006.01) |
| *F04D 25/06* | (2006.01) |

(52) U.S. Cl.
CPC ......... *F04D 27/002* (2013.01); *F04D 19/048* (2013.01); *F04D 27/001* (2013.01); *F16K 3/06* (2013.01); *F16K 31/041* (2013.01); *F16K 51/02* (2013.01); *F04D 25/06* (2013.01); *F04D 29/403* (2013.01); *H01L 21/67017* (2013.01)

(58) Field of Classification Search
CPC ........... F04D 19/04–042; F04D 19/048; F04D 27/001; F04D 27/003; F04D 29/048; F04D 29/058; F04D 27/002; F16K 31/02
See application file for complete search history.

(56) References Cited

U.S. PATENT DOCUMENTS

2015/0132969 A1* 5/2015 Koiwa ............... H01L 21/67109
438/715

FOREIGN PATENT DOCUMENTS

JP 2010-135371 6/2010

* cited by examiner

*Primary Examiner* — Reinaldo Sanchez-Medina
*Assistant Examiner* — Nicole Gardner
(74) *Attorney, Agent, or Firm* — Renner, Otto, Boisselle & Sklar, LLP

(57) ABSTRACT

A vacuum valve attached to a vacuum pump configured to generate regenerative power to perform a stop operation upon blackout, comprises: a first power input section to which power is input from a commercial power source; a second power input section to which the regenerative power generated at the vacuum pump is input; and a valve source circuit to which the power input to each of the first and second power input sections is supplied. When the power from the commercial power source is supplied to the first power input section, the vacuum valve is operated by the supplied power, and when the power from the commercial power source is stopped, the vacuum valve is operated by the regenerative power.

6 Claims, 6 Drawing Sheets

VACUUM VALVE AND VACUUM PUMP

BACKGROUND OF THE INVENTION

1. Technical Field

The present invention relates to a vacuum valve and a vacuum pump attached to the vacuum valve.

2. Background Art

In a vacuum processing device (e.g., a film formation device or an etching device) for manufacturing a semiconductor, a flat panel display, a touchscreen, etc., film formation processing or etching processing is performed while the amount of process gas to be supplied is being controlled, for example. In such a vacuum processing device, a vacuum valve of which conductance is variable is provided between a process chamber and a vacuum pump. The conductance of the vacuum valve is adjusted for pressure adjustment of the process chamber.

In general, the vacuum valve of which conductance is variable changes the conductance thereof by a change in the degree of opening of a valve body (see, e.g., Patent Literature 1 (JP-A-2010-135371)). Moreover, the valve body can be fully closed, and can be used as a gate valve by operation between a fully-closed state and a fully-open state.

In the case of blackout during a process, danger avoidance processing needs to be performed. For example, in the case of a process using inflammable gas, the vacuum valve is brought into the open state upon blackout, thereby preventing accumulation of the inflammable gas in the process chamber. In the case of a process using toxic gas, the vacuum valve is brought into the fully-closed state upon blackout, thereby closing the toxic gas in the process chamber to avoid danger.

However, a backup power source is necessary for performing such danger avoidance processing. This leads to a vacuum valve cost increase.

SUMMARY OF THE INVENTION

A vacuum valve attached to a vacuum pump configured to generate regenerative power to perform a stop operation upon blackout, comprises: a first power input section to which power is input from a commercial power source; a second power input section to which the regenerative power generated at the vacuum pump is input; and a valve source circuit to which the power input to each of the first and second power input sections is supplied. When the power from the commercial power source is supplied to the first power input section, the vacuum valve is operated by the supplied power, and when the power from the commercial power source is stopped, the vacuum valve is operated by the regenerative power.

The vacuum valve further comprises: a backflow prevention circuit configured to prevent the power input from the first power input section from flowing back to the second power input section, and prevent the power input from the second power input section from flowing back to the first power input section.

In operation using the regenerative power, the vacuum valve is operated with a lower power than that in operation using the power from the commercial power source.

The vacuum valve further comprises: a conversion section configured to convert a voltage of the regenerative power into an input voltage for the valve source circuit.

A vacuum pump attached to the vacuum valve, comprises: a regenerative power generation section configured to convert, upon blackout, rotation energy of a rotor body provided with a pump rotor into power, thereby generating regenerative power; and a conversion section configured to convert a voltage of the regenerative power into an input voltage for the valve source circuit, thereby supplying the input voltage to the second power input section of the vacuum valve.

A vacuum pump attached to the vacuum valve, comprises: a regenerative power generation section configured to convert, upon blackout, rotation energy of a rotor body provided with a pump rotor into power, thereby generating regenerative power; and a supply section configured to supply the regenerative power to the second power input section of the vacuum valve.

According to the present invention, the danger avoidance processing of the vacuum valve upon blackout can be performed without the backup power source.

DETAILED DESCRIPTION OF THE EXEMPLARY EMBODIMENTS

Hereinafter, embodiments of the present invention will be described with reference to the drawings.

First Embodiment

Figure 1:
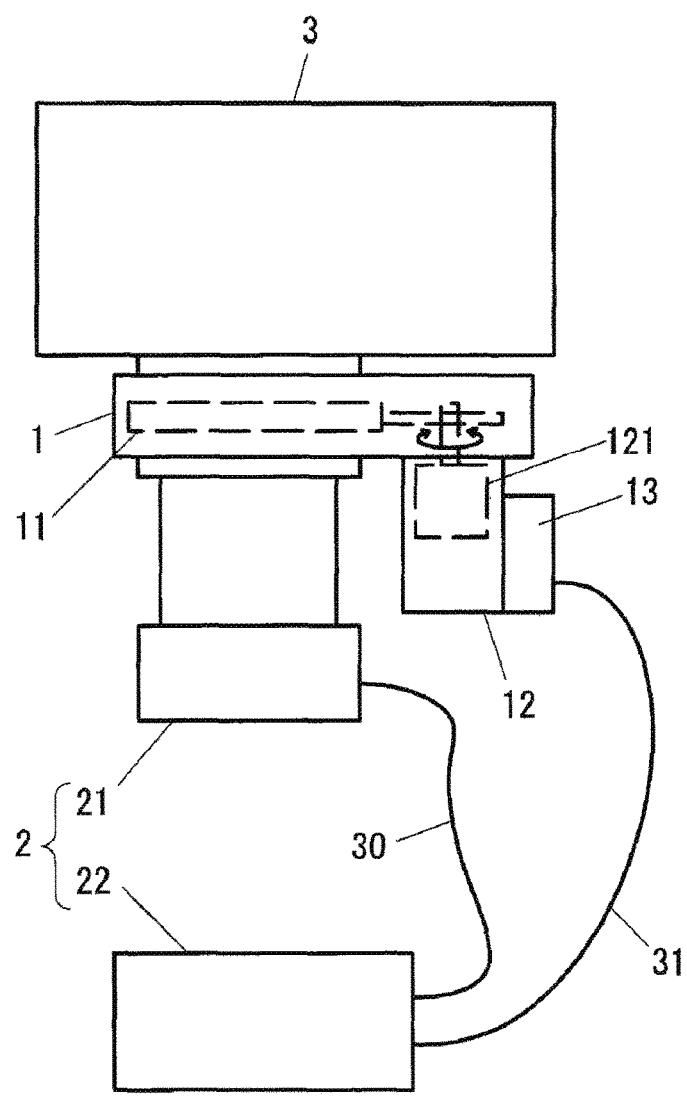
FIG. 1 is a view of an example of a vacuum system including a vacuum valve of the present invention.

FIG. 1 is a view of an example of a vacuum system including a vacuum valve of the present invention. A reference numeral "3" represents a process chamber of a vacuum processing device. A vacuum pump 2 is attached to the process chamber 3 through a vacuum valve 1. In general, a turbo-molecular pump is often used as a vacuum pump of a vacuum processing device, and the vacuum pump 2 in the present embodiment is also described as a turbo-molecular pump.

The vacuum valve 1 is configured such that a valve conductance is changed by driving of a valve body 11. The valve body 11 is openably/closably driven by a valve body motor 121 provided at a valve drive section 12. The valve drive section 12 is controlled by a valve control section 13. The vacuum pump 2 includes a pump main body 21 configured to perform vacuum pumping, and a control unit 22 configured to control the pump main body 21.

The pump main body 21 and the control unit 22 are connected together through a cable 30. Moreover, the control unit 22 and the valve control section 13 of the vacuum valve 1 are connected together through a cable 31. The cable 31 is provided for supplying the vacuum valve 1 with regenerative power generated at the vacuum pump 2.

Figure 2:
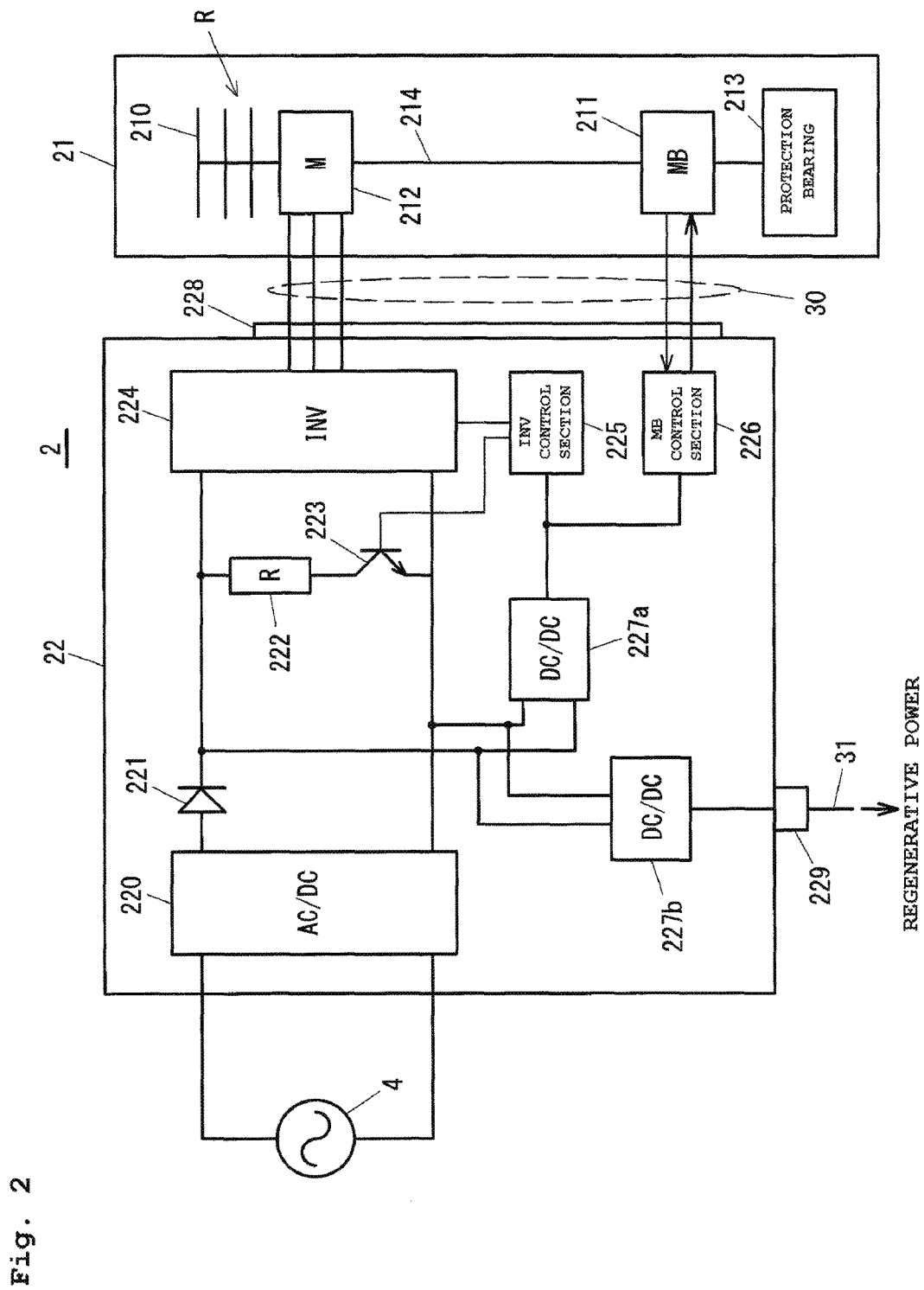
FIG. 2 is a block diagram of a schematic configuration of a vacuum pump.

FIG. 2 is a block diagram of a schematic configuration of the vacuum pump 2. The pump main body 21 includes, for example: stationary blades (not shown); a pump rotor 210 provided with rotor blades forming, together with the stationary blades, a turbo pump stage; a rotor shaft 214 fixed to the pump rotor 210; a motor 212 configured to rotatably drive, at high speed, a rotor body R having the pump rotor 210 and the rotor shaft 214; a magnetic bearing 211 configured to support the rotor shaft 214 in a non-contact state; and a protection bearing 213 configured to support the rotor shaft 214 in a non-energization state.

AC power is supplied from a commercial power source 4 to the control unit 22. The input AC power is subjected to power conversion into DC power by an AC/DC converter 220. A three-phase inverter 224 is connected to an output-side DC line of the AC/DC converter 220. The three-phase inverter 224 is configured to convert, into AC power, the DC power supplied from the AC/DC converter 220, thereby driving the motor 212. The three-phase inverter 224 is controlled by an inverter control section 225 such that AC power with a frequency necessary for rotation of the motor 212 is output.

A DC/DC converter 227a is configured to lower the voltage of the DC power from the DC line, thereby supplying such power to the inverter control section 225 and a magnetic bearing control section 226. The magnetic bearing control section 226 is configured to supply drive power to the magnetic bearing 211 provided at the pump main body 21. The magnetic bearing 211 is provided with a displacement sensor (not shown) configured to detect displacement of the rotor shaft 214. The magnetic bearing control section 226 is configured to control the drive power for the magnetic bearing 211 based on detection information of the displacement sensor such that the rotor shaft 214 is supported at a desired position in the non-contact state.

For stopping the pump main body 21, regenerative control of the three-phase inverter 224 is performed such that rotation of the rotor shaft 214 is decelerated by regenerative braking. Thus, a series circuit of a brake resistor 222 and a switch element (a transistor) 223 is, on the DC line, provided in parallel with the three-phase inverter 224. ON/OFF of the switch element 223 is controlled by the inverter control section 225. Upon regenerative braking, the switch element 223 is turned ON, and the regenerative power is consumed by the brake resistor 222. A diode 221 for regenerative power backflow prevention is provided on the DC line.

In the case of stopping a power supply from the commercial power source 4 due to blackout etc., the regenerative power is input to the DC/DC converter 227a in the vacuum pump 2. As a result, the inverter control section 225 and the magnetic bearing control section 226 are operated by the regenerative power, and magnetic levitation of the rotor shaft 214 is maintained by the regenerative power. The three-phase inverter 224 and the magnetic bearing control section 226 are connected to the motor 212 and the magnetic bearing 211 through an interface panel 228. Note that when the regenerative power is supplied to the inverter control section 225 and the magnetic bearing control section 226, the switch element 223 is turned OFF.

In the present embodiment, a DC/DC converter 227b is provided for supplying the regenerative power to the vacuum valve 1. In general, the voltage of the regenerative power is different from a supply voltage required for the vacuum valve 1 side. For example, the voltage of the regenerative power is DC 120 V, and the voltage on the vacuum valve 1 side is DC 24 V. Thus, the voltage of the regenerative power is, using the DC/DC converter 227b, converted into the voltage required for the vacuum valve 1 side. The regenerative power output from the DC/DC converter 227b is output from an output terminal 229 provided at the control unit 22. The cable 31 illustrated in FIG. 1 is connected to the output terminal 229.

Figure 3:
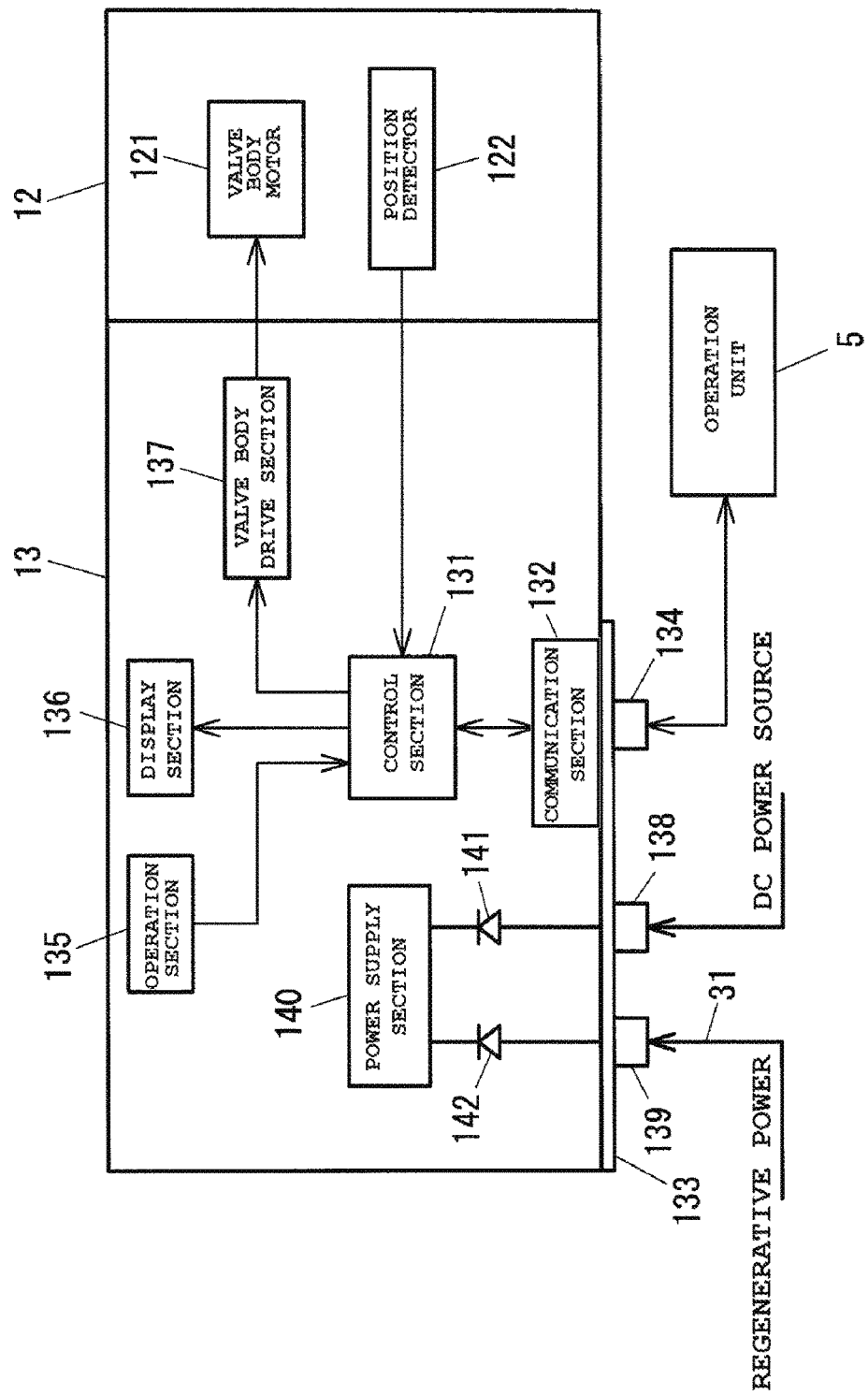
FIG. 3 is a block diagram of a valve drive section and a valve control section in the vacuum valve.

FIG. 3 is a block diagram of the valve drive section 12 and the valve control section 13 in the vacuum valve 1. The valve drive section 12 is provided with the valve body motor 121 for openably/closably driving the valve body 11 (see FIG. 1). The drive position of the valve body 11 is detected by a position detector 122. For example, an encoder configured to detect the amount of rotation of the valve body motor 121 is used as the position detector 122. The position of the valve body 11 can be obtained from the amount of rotation of the valve body motor 121.

A drive command is, through a communication section 132, input to a control section 131 provided at the valve control section 13. In an example illustrated in FIG. 3, the drive command is input from an operation unit 5 connected to a remote terminal 134 provided at an interface panel 133. Moreover, an operation section 135 provided at the valve control section 13 is manually operated so that the drive command can be input to the control section 131. The control section 131 outputs, to a valve body drive section 137, a control signal based on the input drive command. The valve body drive section 137 drives the valve body motor 121 based on the control signal from the control section 131. A vacuum valve state, setting, etc. are displayed on a display section 136.

The interface panel 133 of the valve control section 13 is provided with terminals 138, 139 for supplying DC power to the valve control section 13. A DC power source is connected to the terminal 138. For example, DC power subjected to AC/DC conversion of commercial power source in the vacuum processing device is used for the DC power source. On the other hand, the cable 31 is connected to the terminal 139, and the regenerative power is supplied from the control unit 22 illustrated in FIG. 2 to the terminal 139.

The DC power input through the terminal 138 is input to a power supply section 140 through a diode 141 for backflow prevention. The regenerative power input through the terminal 139 is input to the power supply section 140 through a diode 142 for backflow prevention. The power supply section 140 supplies the power to each of the valve control section 13 and the valve drive section 12. In a normal state, the power from the DC power source is supplied to the terminal 138, and the diode 142 prevents the current from the DC power source from flowing back to the terminal 139 side. Upon blackout, the regenerative power is supplied to the terminal 139, and the diode 141 prevents the current of the regenerative power from flowing back to the terminal 138 side.

Figure 6:
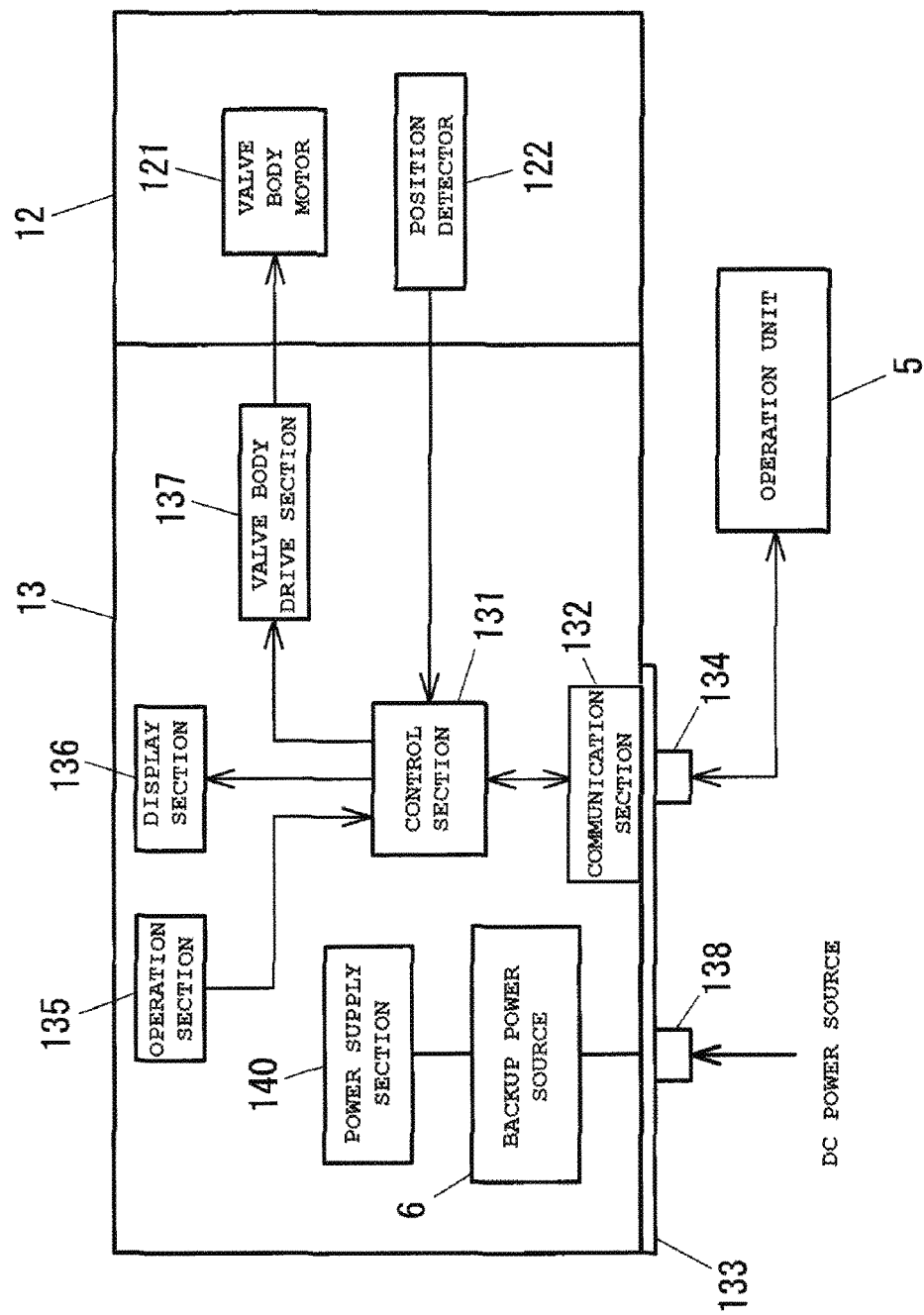
FIG. 6 is a block diagram of an example of a valve control section in a case where a backup power source as measures against blackout is provided at a vacuum valve.

FIG. 6 illustrates an example of the valve control section 13 in a case where a backup power source 6 as measures against blackout is provided at the vacuum valve 1. In this case, the power from the DC power source is supplied to the power supply section 140 through the backup power source 6. Normally, the vacuum valve 1 is operated by the DC power supplied from the outside. However, when input from the DC power source is stopped due to blackout etc., danger avoidance operation is performed by power from the backup power source 6. Note that the danger avoidance operation begins, for example, when blackout information is input from a vacuum-processing-device-side control section.

On the other hand, in the present embodiment, the terminal 138 as a power input section to which the power from the commercial power source is supplied, the terminal 139 as a power input section to which the regenerative power generated at the vacuum pump 2 is supplied, and the power supply section 140 as a valve source circuit to which the power is input from each of the terminals 138, 139 are provided. When the power is supplied from the commercial power source to the terminal 138, the vacuum valve 1 is operated by such power. When the power from the commercial power source is stopped, the vacuum valve 1 is operated by the regenerative power. Thus, upon blackout, the danger avoidance operation of the vacuum valve 1 can be performed utilizing the regenerative power generated at the vacuum pump 2. With such a configuration, a cost can be reduced without a need for providing the backup power source as the measures against blackout at the vacuum valve 1.

Moreover, e.g., a secondary battery or an electric double layer capacitor is used for the backup power source 6. However, these components are life-limited products, and therefore, periodic maintenance is needed. However, in the vacuum valve 1 of the present embodiment, there is no such a problem.

Further, the diodes 141, 142 as a backflow prevention circuit are provided as illustrated in FIG. 3. This can prevent the power input from the terminal 138 from flowing back to the terminal 139, and can prevent the power input from the terminal 139 from flowing back to the terminal 138.

In addition, in operation (the danger avoidance operation) using the regenerative power, the vacuum valve 1 is preferably operated with a lower power as compared to that in operation using the power from the commercial power source. This is because the regenerative power generated at the vacuum pump 2 is used for maintaining magnetic levitation using the magnetic bearing 211. Thus, the danger avoidance operation at the vacuum valve 1 needs to be performed within a range of surplus power obtained by subtracting power consumption of the magnetic bearing 211 from the generated regenerative power such that magnetic levitation by the magnetic bearing 211 is not interfered. For this reason, in the danger avoidance operation at the vacuum valve 1, the drive speed of the valve body 11 is, for suppressing a regenerative power use amount, preferably decreased as compared to that in the normal state, or the valve body 11 is preferably operated in an intermittent manner.

Note that in description above, the DC/DC converter 227b is configured to convert the voltage of the regenerative power into the same voltage (e.g., DC 24 V) as that of the DC power source. However, the present invention is not limited to above, and the DC/DC converter 227b may be configured to convert the voltage of the regenerative power into a voltage (e.g., DC 23 V) slightly lower than the voltage of the DC power source. With this configuration, the vacuum valve 1 is operated by the power from the DC power source even in the case of a power supply from both of the terminals 138, 139. For example, even in the case of a pump stop state due to failure on the vacuum pump 2 side, the regenerative power is supplied to the terminal 138. With the above-described configuration, the regenerative power is not consumed on the vacuum valve 1 side. Thus, magnetic levitation can be reliably maintained by the regenerative power in the vacuum pump 2.

Second Embodiment

Figure 4:
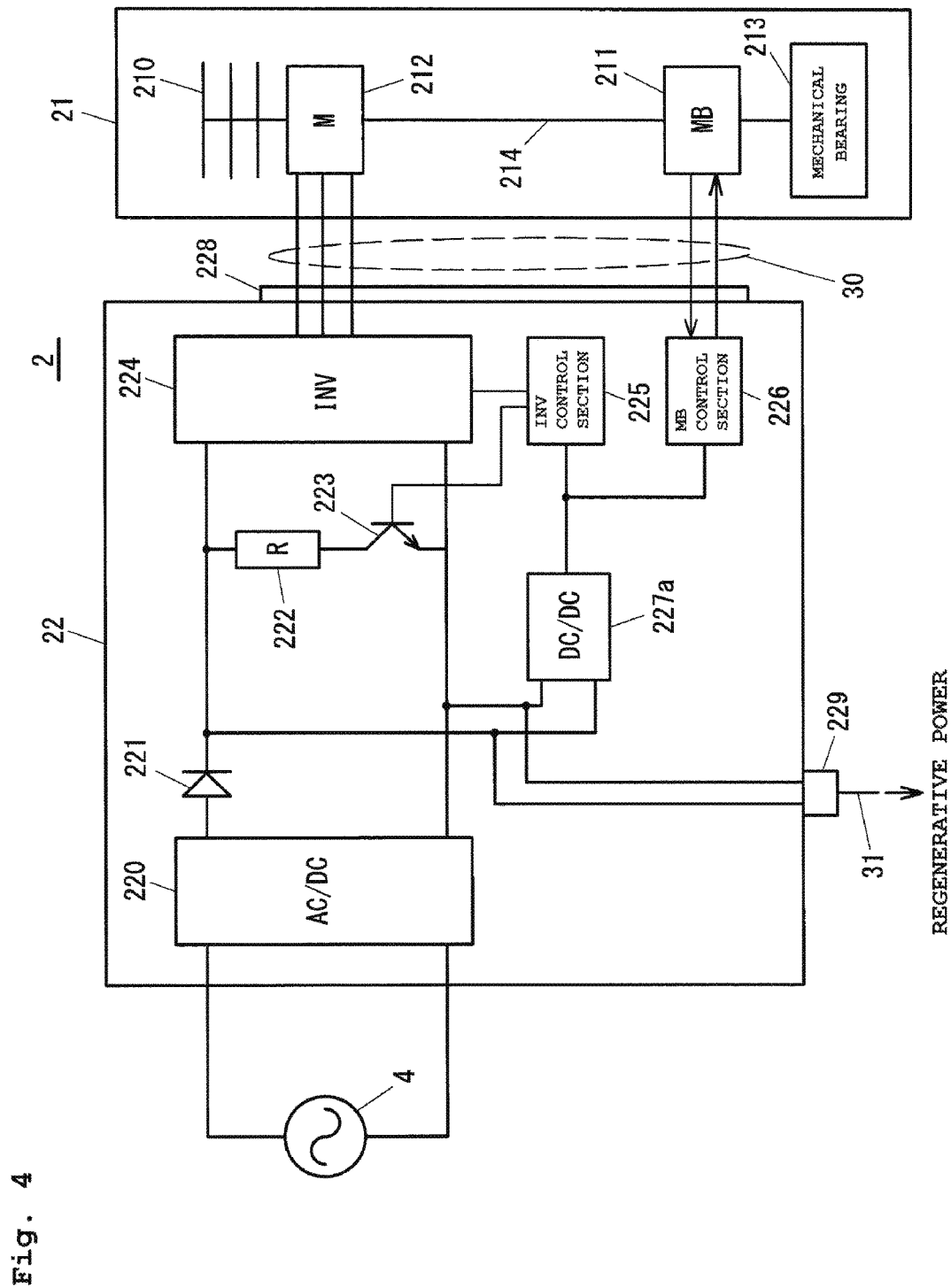
FIG. 4 is a block diagram of a schematic configuration of a vacuum pump in a second embodiment.

A second embodiment of the present invention will be described with reference to FIGS. 4 and 5. FIG. 4 is a block diagram of a schematic configuration of a vacuum pump 2 in the second embodiment, and corresponds to FIG. 2 of the first embodiment.

The vacuum pump 2 illustrated in FIG. 4 is different from the vacuum pump illustrated in FIG. 2 in that a control unit 22 does not include a DC/DC converter 227b. Other configurations are exactly similar to those in the case of FIG. 2, and the same reference numerals are used. That is, in the second embodiment, it is configured such that regenerative power output from a three-phase inverter 224 is output from an output terminal 229 without being lowered by the DC/DC converter.

Figure 5:
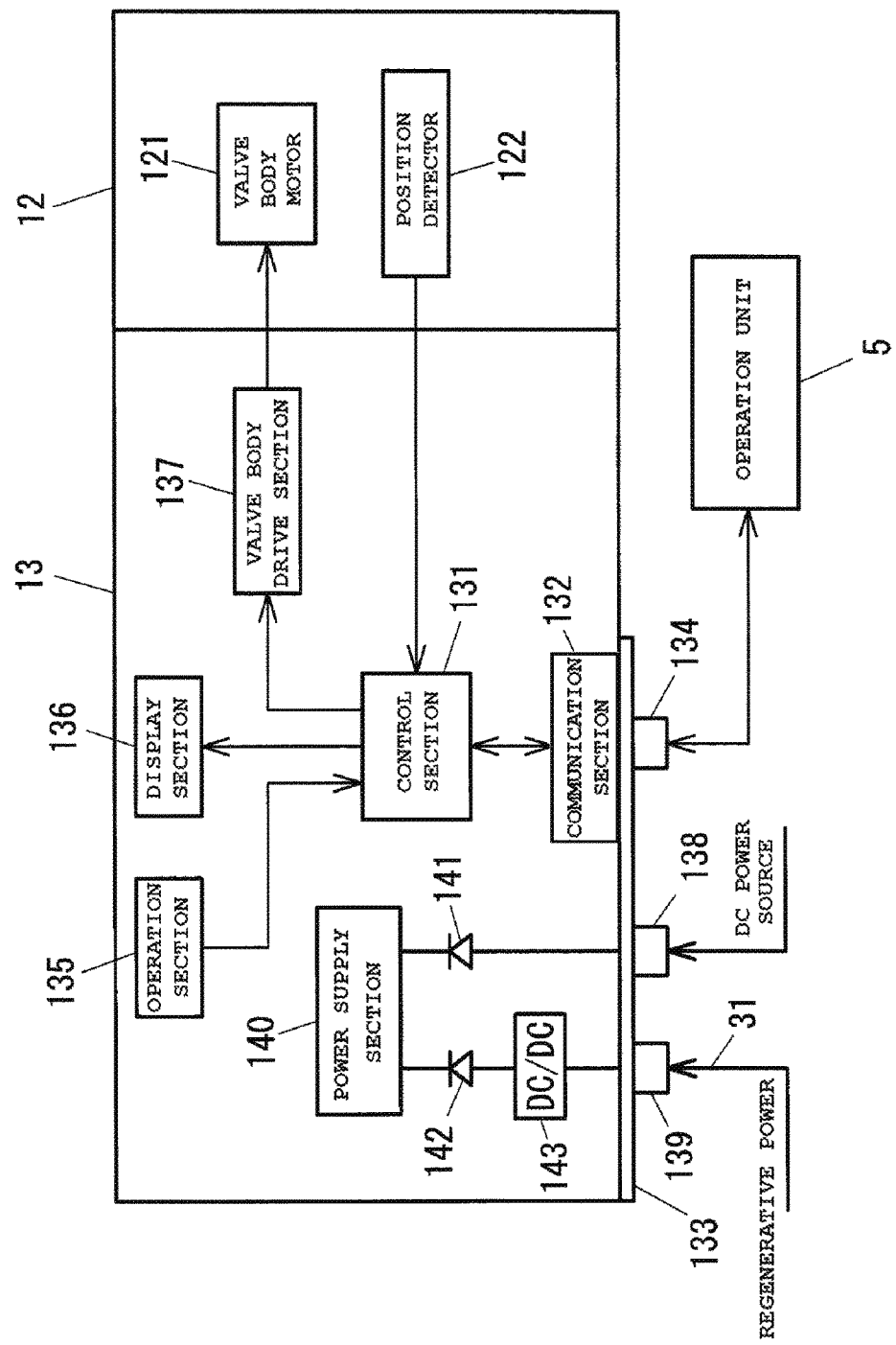
FIG. 5 is a block diagram of schematic configurations of a valve drive section and a valve control section in the second embodiment.

FIG. 5 is a block diagram of schematic configurations of a valve drive section 12 and a valve control section 13 in the second embodiment, and corresponds to FIG. 3 of the first embodiment. A difference of the configuration of FIG. 5 from the configuration of FIG. 3 is that a DC/DC converter 143 is further provided. Other configurations are similar to those in the case of FIG. 3. The DC/DC converter 143 is disposed on a regenerative power line between a terminal 139 and a diode 142.

As illustrated in FIG. 4, the regenerative power output from the three-phase inverter 224 is output from the terminal 229 without the DC/DC converter, and then, is input to the terminal 139 of the valve control section 13 through a cable 31. Thus, in the second embodiment, the DC/DC converter 143 is provided at the valve control section 13, thereby converting the voltage of the regenerative power into a supply voltage required for a vacuum valve side.

In the second embodiment, the regenerative power generated at the vacuum pump 2 is, as in the above-described first embodiment, also utilized upon blackout so that danger avoidance operation of a vacuum valve 1 can be performed without a need for using a backup power source as measures against blackout. Moreover, there is no problem of maintenance of the backup power source.

Further, in the second embodiment, the DC/DC converter 143 configured to convert the voltage of the regenerative power into an input voltage for a power supply section 140 is provided on the vacuum valve 1 side as illustrated in FIG. 5. With this configuration, the vacuum pump 2 is applicable to a plurality of vacuum valves 1 with different input voltages.

In addition, in the vacuum pump 2 described above in the first and second embodiments, the three-phase inverter 224 functions, upon blackout, as a regenerative power generation section configured to convert rotation energy of the rotor body R into power to generate regenerative power. Such regenerative power is supplied to the vacuum valve 1 through the output terminal 229 and the cable 31 as supply sections. Thus, the vacuum valve 1 can perform the danger avoidance operation upon blackout by means of the regenerative power from the vacuum pump 2 side. In this case, the DC/DC converter configured to convert the voltage of the regenerative power into the input voltage on the vacuum valve 1 side may be provided on the vacuum pump 2 side as in the DC/DC converter 227b of FIG. 2, or may be provided on the vacuum valve 1 side as in the DC/DC converter 143 of FIG. 5.

Note that as long as the features of the present invention are not impaired, the present invention is not limited to the above-described embodiments. For example, in the above-described embodiments, the case of using the turbo-molecular pump as the vacuum pump has been described as an example, but the present invention is not limited to the turbo-molecular pump as long as the vacuum pump is configured to generate the regenerative power upon rotation deceleration.

What is claimed is:

1. A vacuum valve attached to a vacuum pump configured to generate regenerative power to perform a stop operation upon blackout, comprising:
   a first power input section to which power is input from a commercial power source;

a second power input section to which the regenerative power generated at the vacuum pump is input; and a valve source circuit to which the power input to each of the first and second power input sections is supplied, wherein when the power from the commercial power source is supplied to the first power input section, the vacuum valve is operated by the supplied power, and when the power from the commercial power source is stopped, the vacuum valve is operated by the regenerative power, and the vacuum valve further comprising:

a backflow prevention circuit configured to
  prevent the power input from the first power input section from flowing back to the second power input section, and
  prevent the power input from the second power input section from flowing back to the first power input section.

2. A vacuum valve attached to a vacuum pump configured to generate regenerative power to perform a stop operation upon blackout, comprising:

a first power input section to which power is input from a commercial power source;

a second power input section to which the regenerative power generated at the vacuum pump is input; and a valve source circuit to which the power input to each of the first and second power input sections is supplied, when the power from the commercial power source is supplied to the first power input section, the vacuum valve is operated by the supplied power, and when the power from the commercial power source is stopped, the vacuum valve is operated by the regenerative power and in operation using the regenerative power, the vacuum valve is operated with a lower power than that in operation using the power from the commercial power source.

3. A vacuum valve attached to a vacuum pump configured to generate regenerative power to perform a stop operation upon blackout, comprising:

a first power input section to which power is input from a commercial power source;

a second power input section to which the regenerative power generated at the vacuum pump is input; and a valve source circuit to which the power input to each of the first and second power input sections is supplied, wherein when the power from the commercial power source is supplied to the first power input section, the vacuum valve is operated by the supplied power, and when the power from the commercial power source is stopped, the vacuum valve is operated by the regenerative power and the vacuum valve further comprising:

a conversion section configured to convert a voltage of the regenerative power into an input voltage for the valve source circuit.

4. A vacuum pump attached to the vacuum valve according to claim 1, comprising:

a regenerative power generation section configured to convert, upon blackout, rotation energy of a rotor body provided with a pump rotor into power, thereby generating regenerative power; and a conversion section configured to convert a voltage of the regenerative power into an input voltage for the valve source circuit, thereby supplying the input voltage to the second power input section of the vacuum valve.

5. A vacuum pump attached to the vacuum valve according to claim 3, comprising:

a regenerative power generation section configured to convert, upon blackout, rotation energy of a rotor body provided with a pump rotor into power, thereby generating regenerative power; and a supply section configured to supply the regenerative power to the second power input section of the vacuum valve.

6. A vacuum pump attached to the vacuum valve according to claim 2, comprising:

a regenerative power generation section configured to convert, upon blackout, rotation energy of a rotor body provided with a pump rotor into power, thereby generating regenerative power; and a conversion section configured to convert a voltage of the regenerative power into an input voltage for the valve source circuit, thereby supplying the input voltage to the second power input section of the vacuum valve.

* * * * *